US012791589B2

(12) United States Patent
Kumagai et al.

(10) Patent No.: US 12,791,589 B2
(45) Date of Patent: Nov. 10, 2026

(54) CURRENT SENSOR

(71) Applicant: Alps Alpine Co., Ltd., Tokyo (JP)

(72) Inventors: Yuu Kumagai, Miyagi-ken (JP); Manabu Tamura, Miyagi-ken (JP); Hideaki Takano, Miyagi-ken (JP)

(73) Assignee: Alps Alpine Co., Ltd. (JP)

( * ) Notice: Subject to any disclaimer, the term of this patent is extended or adjusted under 35 U.S.C. 154(b) by 122 days.

(21) Appl. No.: 18/535,092

(22) Filed: Dec. 11, 2023

(65) Prior Publication Data

US 2024/0248121 A1 Jul. 25, 2024

(30) Foreign Application Priority Data

Jan. 25, 2023 (JP) ................................ 2023-009404

(51) Int. Cl.
*G01R 15/20* (2006.01)

(52) U.S. Cl.
CPC ................................ *G01R 15/207* (2013.01)

(58) Field of Classification Search
CPC .............. G01R 15/20-26; G01R 19/00-16504
See application file for complete search history.

(56) References Cited

U.S. PATENT DOCUMENTS 11,105,831 B2 8/2021 Esaka et al.
11,150,274 B2 10/2021 Tamura et al.
2010/0194381 A1* 8/2010 Ito ........................ G01R 15/207 324/117 R
2020/0158760 A1* 5/2020 Fukuhara ............. G01R 15/207
2024/0110952 A1* 4/2024 Tamura .............. G01R 19/0092

FOREIGN PATENT DOCUMENTS

JP 2017-102023 A 6/2017

* cited by examiner

*Primary Examiner* — Lee E Rodak
*Assistant Examiner* — Jeremiah J Barron
(74) *Attorney, Agent, or Firm* — Harness, Dickey & Pierce, P.L.C.

(57) ABSTRACT

A current sensor has a bus bar through which a current under measurement flows, a magnetism sensing portion placed so as to face the bus bar in an X direction, and a chassis that incorporates the magnetism sensing portion and part of the bus bar. In a Y direction orthogonal to the X direction, the bus bar has a first connection end protruding from a Y1 side of the chassis and a second connection end protruding from a Y2 side of the chassis. The first connection end and second connection end are at different positions in the X direction when viewed from a Z direction orthogonal to the X direction and Y direction. An opposing portion, facing the magnetism sensing portion, of the bus bar crosses the Y direction when viewed from the Z direction.

9 Claims, 10 Drawing Sheets

CURRENT SENSOR

CLAIM OF PRIORITY

This application claims benefit of Japanese Patent Application No. 2023-009404 filed on Jan. 25, 2023, which is hereby incorporated by reference.

BACKGROUND OF THE INVENTION

1. Field of the Invention

The present invention relates to a current sensor that detects a magnetic field generated when a current under measurement follows through a bus bar and measures the current value of the current under measurement from the detected magnetic field.

2. Description of the Related Art

In recent years, a current sensor that is attached to any type of unit and measures a current under measurement flowing in the unit is used to control and monitor the unit. A known current sensor of this type uses a magneto-electric conversion element that senses a magnetic field generated by a flow of a current under measurement through a current path.

Japanese Unexamined Patent Application Publication No. 2017-102023 describes a current sensor that has a plurality of bus bars, a plurality of magnetic sensors, a circuit board on which the magnetic sensors are mounted, a case, lid portions, and magnetic shields that are insert-molded to the lid portions, with the object of providing a current sensor that can be downsized without measurement precision being lowered.

With the current sensor described in Japanese Unexamined Patent Application Publication No. 2017-102023, both ends of the bus bar protrude from the case at different positions in the up-down direction, so the bus bar has bent portions in the case so that the bus bar is routed in a stepped shape so as to be along the side walls and bottom surface of the case. The magnetic sensor and magnetic shield are placed in a space generated as a result of bending the bus bar to improve the storage efficiency in the interior of the current sensor.

The current sensor described in Japanese Unexamined Patent Application Publication No. 2017-102023 is problematic in that since the magnetic sensor faces the bus bar in two directions, when the bus bar generates heat due to a flow of a current in the bus bar, temperature around the magnetic sensor (magnetism sensing portion) is likely to become too high. In recent years, a shift toward large currents is in progress in hybrid vehicles (HVs), electric vehicles (EVs), and the like. Along with this, the bus bar generates much more heat. This leads to the fear that temperature around the magnetic sensor exceeds heat-resistant temperature and the measurement precision of the current sensor is thereby lowered.

SUMMARY OF THE INVENTION

In view of this, the present invention provides a current sensor suitable for large current measurement with the suppression of a drop in measurement precision due to a rise in the temperature of the magnetism sensing portion.

The present invention has the following structure as a means for solving the problem described above.

A current sensor has a bus bar through which a current under measurement flows, a magnetism sensing portion placed so as to face the bus bar in a first direction, and a chassis that incorporates the magnetism sensing portion and part of the bus bar. In a second direction orthogonal to the first direction, the bus bar has a first connection end protruding from one side of the chassis and also has a second connection end protruding from another side of the chassis. The first connection end and the second connection end are at different positions in the first direction when viewed from a third direction orthogonal to the first direction and to the second direction. An opposing portion, facing the magnetism sensing portion, of the bus bar crosses the second direction when viewed from the third direction.

Since the opposing portion of the bus bar is places so as to crosses the second direction, the length of the bus bar positioned in the case can be made shorter than when the bus bar is routed along the side walls and bottom of the case. When the bus bar is shortened, the resistance of the bus bar is reduced, and the amount of heat generated by the bus bar due to a flow of a current under measurement can thereby be reduced.

The opposing portion may be formed so that a distance to a flat surface gradually becomes large from the same side as the first connection end toward the same side as the second connection end in the second direction, the flat surface passing through a protruding portion of the first connection end and being parallel to the second direction and to the third direction.

Since the distance between the flat surface and the opposing portion on the same side as the second connection end is prolonged, when a high-temperature unit such as a power card is connected to the second connection end, the effect of heat generated by the high-temperature unit on the magnetism sensing portion through the bus bar and circuit board can be reduced.

The magnetism sensing portion may have a sensing surface and may be capable of sensing a magnetic field in a direction parallel to the sensing surface. The magnetism sensing portion may be placed so that the normal direction of the sensing surface is parallel to the first direction.

By causing the sensing surface to directly face the bus bar, an induced magnetic field generated when a current under measurement flows in the bus bar can be precisely sensed by the magnetism sensing portion.

The current sensor may have a magnetic shield held in the chassis.

The current sensor may have a first magnetic shield having a flat plate portion formed in a flat plate shape and a second magnetic shield having a flat plate portion formed in a flat plate shape. The first magnetic shield may be placed on a side in the first direction, the side being opposite to the magnetism sensing portion with respect to the opposing portion, so that the normal direction of a magnetic shield surface of the flat plate portion becomes parallel to the normal direction of an opposing surface of the opposing portion. The second magnetic shield may be placed on a side in the first direction, the side being opposite to the opposing portion with respect to the magnetism sensing portion, so that the normal direction of a magnetic shield surface of the flat plate portion becomes parallel to the normal direction of the sensing surface of the magnetism sensing portion.

Since the effect of magnetic noise from the outside can be reduced by the magnetic shields, sensing precision of the current sensor is improved.

The chassis may be composed of a case having a storage space, which is open in the first direction, and a cover that covers the storage space. The magnetism sensing portion may be stored in the storage space. The first magnetic shield and the opposing portion of the bus bar may be insert-molded to the case. The second magnetic shield may be insert-molded to the cover.

Since the first magnetic shield and second magnetic shield can be placed at predetermined positions by insert molding, the current sensor becomes superior in sensing precision with the suppression of error in a relationship among relative positions of members.

The magnetic shield may have a base formed in a flat plate shape and side walls extending, from both ends of the base in the third direction, in a direction parallel to the normal direction of the base and toward a side on which the bus bar is present. The magnetic shield may be placed so that the normal direction of the base and the normal direction of the opposing portion become parallel to each other and that the base and the opposing portion face each other.

Since the magnetic shield having the base and side walls is formed so that the cross section of the magnetic shield is in a U shape, the advantage resulting from reducing the effect of noise from the outside is improved.

The chassis may have a heat sink portion on a side in the first direction, the side being opposite to the side on which the magnetism sensing portion is placed with respect to the opposing portion.

Since heat in the storage space is dissipated to the outside by the heat sink portion, it is possible to suppress a rise in temperature in the storage space.

When a structure including the bus bar and the magnetism sensing portion forms a measurement unit, a plurality of measurement units may be placed along the third direction and may be integrally held in the chassis.

Since a plurality of measurement units are integrally held in the chassis, a plurality of currents can be measured in a state in which the positional relationship among the measurement units is fixed. Therefore, precision in measurement of a plurality of currents can be improved with the suppression of measurement error caused by a change in the relative positions of the measurement units.

According to the present invention, it is possible to suppress a rise in the temperature of the magnetism sensing portion by reducing the amount of heat generated in the bus bar when a current under measurement flows. Therefore, a current sensor can be provided that is suitable for large current measurement and has superior measurement precision.

DESCRIPTION OF THE PREFERRED EMBODIMENTS

Figure 1:
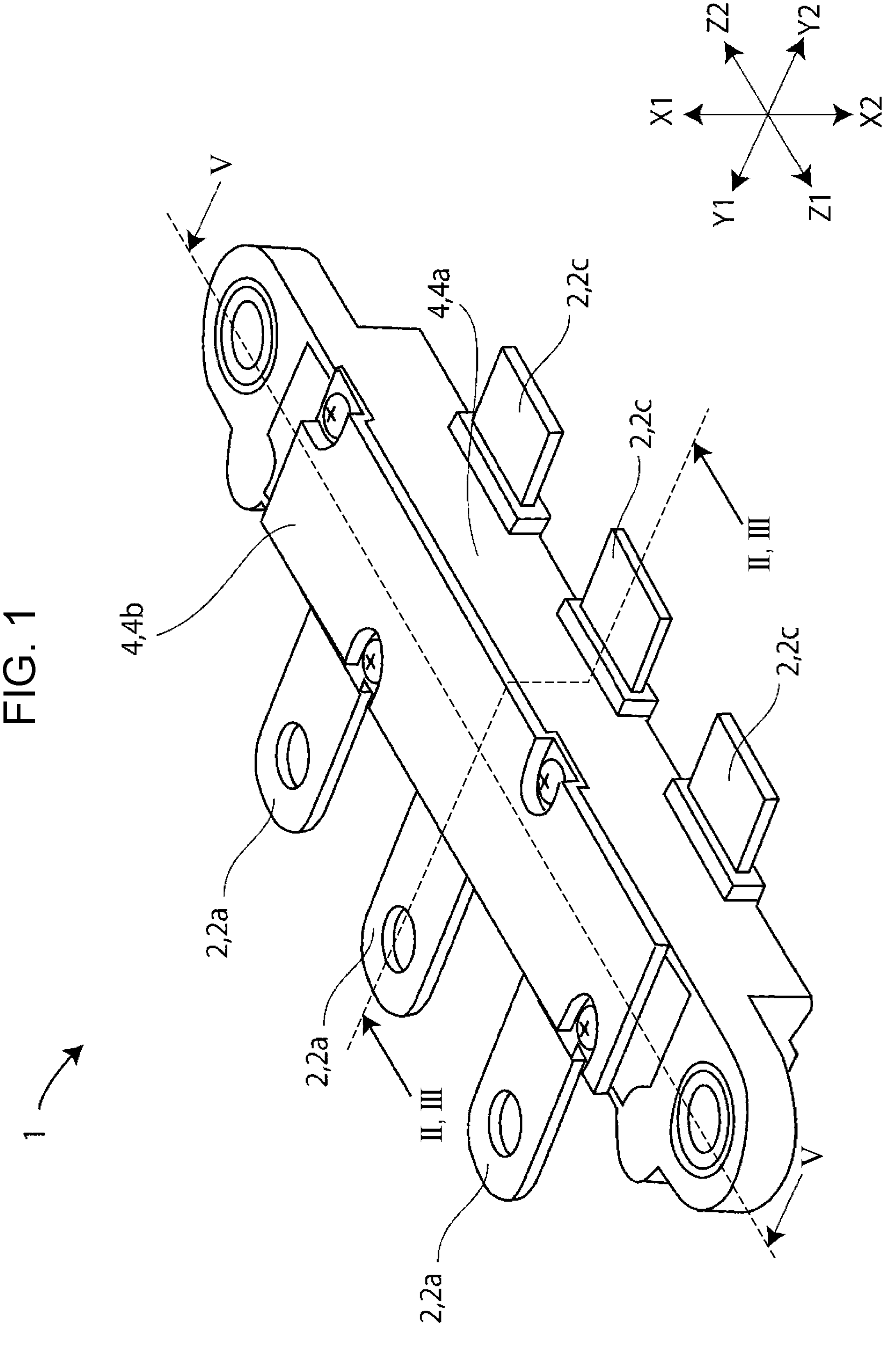
FIG. 1 is a perspective view schematically illustrating a current sensor according to an embodiment.

An embodiment of the present invention will be described below with reference to the attached drawings. Identical members will be assigned identical reference characters in the drawings, and repeated descriptions will be omitted. A reference coordinate system is appropriately indicated in the drawings to indicate a positional relationship among members. In the reference coordinate system, a direction in which a bus bar and a magnetism sensing portion are placed so as to face each other is the X direction (first direction), a direction in which a first connection end and a second connection end protrude from a chassis is the Y direction (second direction), and a direction orthogonal to the X direction and Y direction is the Z direction (third direction). The X direction and Y direction are orthogonal to the sensitivity axis of the magnetism sensing portion. The Z direction matches the direction of the sensitivity axis of the magnetism sensing portion.

Figure 10:
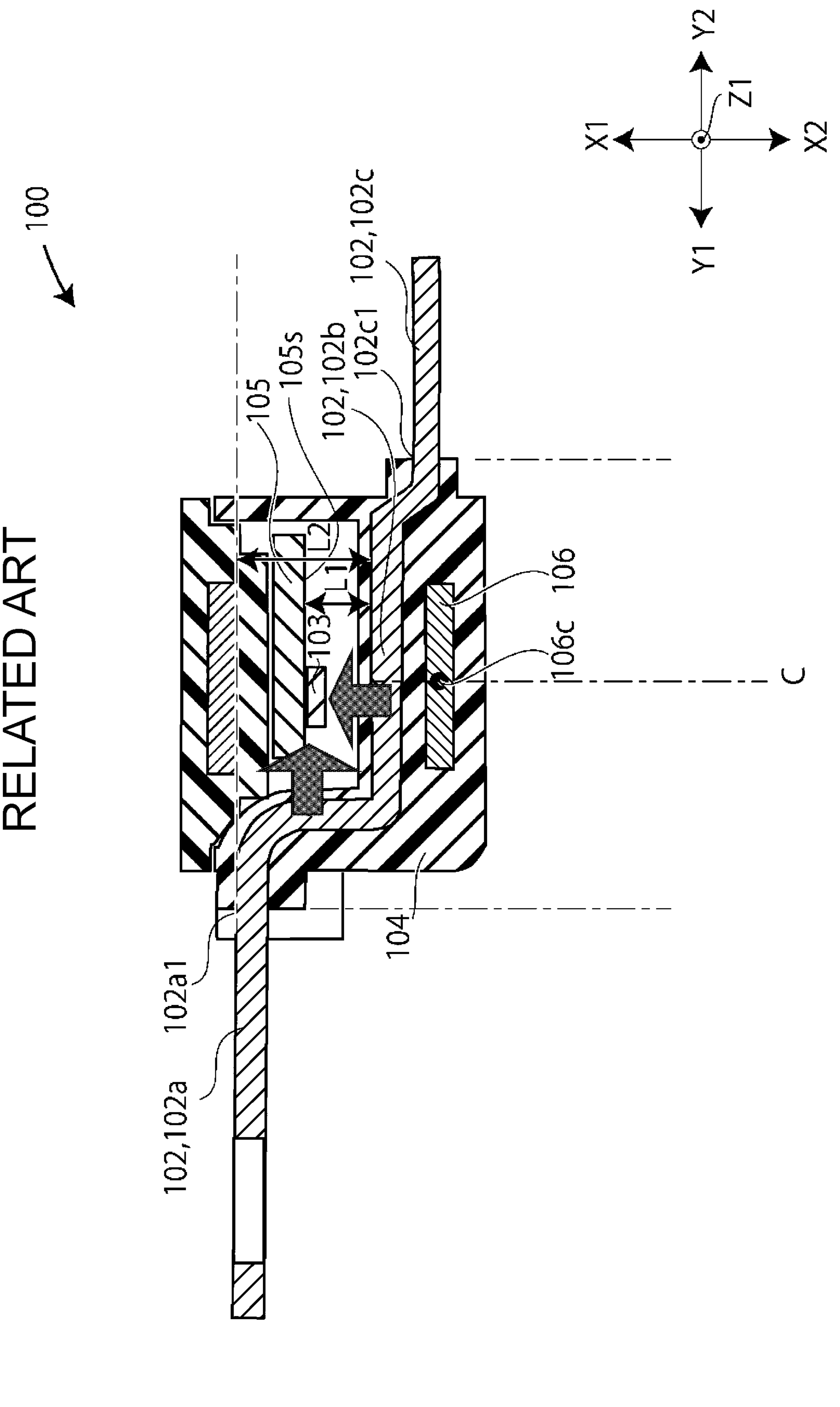
FIG. 10 RELATED ART
FIG. 10 is a sectional view schematically illustrating a conventional current sensor.

FIG. 10 is a sectional view schematically illustrating a current sensor 100 in related art.

A bus bar 102 included in the current sensor 100 has a first connection end 102*a* and a second connection end 102*c*, which protrude from a chassis 104, to connect the bus bar 102 and outside units together. The first connection end 102*a* and second connection end 102*c* protrude from different positions at the chassis 104 in the X direction. When the positions of the first connection end 102*a* and second connection end 102*c* differ in the up-down direction (X direction), an opposing portion 102*b* of the bus bar 102 is placed in parallel to a mounting surface 105*s* of a circuit board 105, on which a magnetism sensing portion 103 is mounted, and both ends of the opposing portion 102*b* are bent.

With the bus bar 102 having bent portions, a portion between the first connection end 102*a* and the second connection end 102*c* is longer than the relevant portion of a straight bus bar having no bent portion. Therefore, the bus bar 102 having bent portions has a higher resistance than the bus bar having no bent portions, and thereby generates much more heat due to a flow of a current under measurement.

Since the bus bar 102 having bent portions is positioned in the X2 direction and Y1 direction of the magnetism sensing portion 103, the bus bar 102 exerts the effect of heat on the magnetism sensing portion 103 from two directions. Therefore, the magnetism sensing portion 103 is more likely to be affected by heat from the bus bar 102 having bent portions than from a bus bar positioned only in one direction.

The magnetism sensing portion 103 is affected by heat from a high-temperature unit such as a switching device (power module), called a power semiconductor, that is connected to the bus bar 102, in addition to heat of the bus bar 102 due to a flow of a current under measurement. With the current sensor 100, the opposing portion 102*b* of the bus bar 102 is placed in parallel to the mounting surface 105*s* of the circuit board 105. Therefore, regardless of whether a high-temperature unit is connected to either of the first connection end 102*a* and second connection end 102*c*, the extent to which the magnetism sensing portion 103 is affected by heat of the high-temperature unit through the bus bar 102 and circuit board 105 is almost the same.

In view of this, the current sensor in this embodiment uses a bus bar different from the bus bar 102 in related art so that highly precise measurement is made possible in response to the shift of currents under measurements toward large currents with the suppression of the effect of heat from a high-temperature unit on the magnetism sensing portion 103. The current sensor in this embodiment will be described below.

FIG. 1 is a perspective view schematically illustrating the current sensor 1 according to this embodiment.

Figure 2:
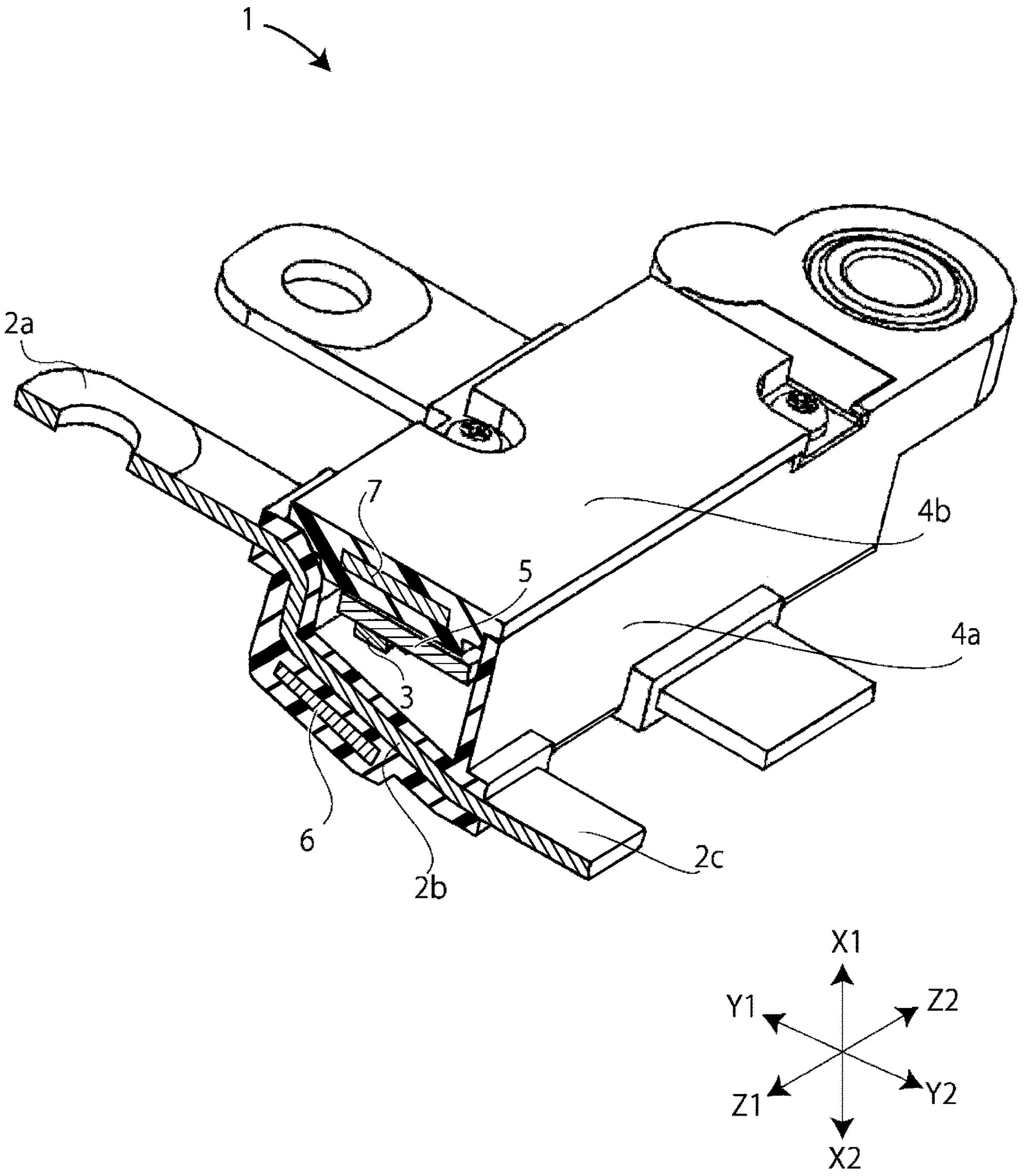
FIG. 2 is a partial perspective sectional view schematically illustrating a cross section along line II-II, III-III in FIG. 1.
Figure 3:
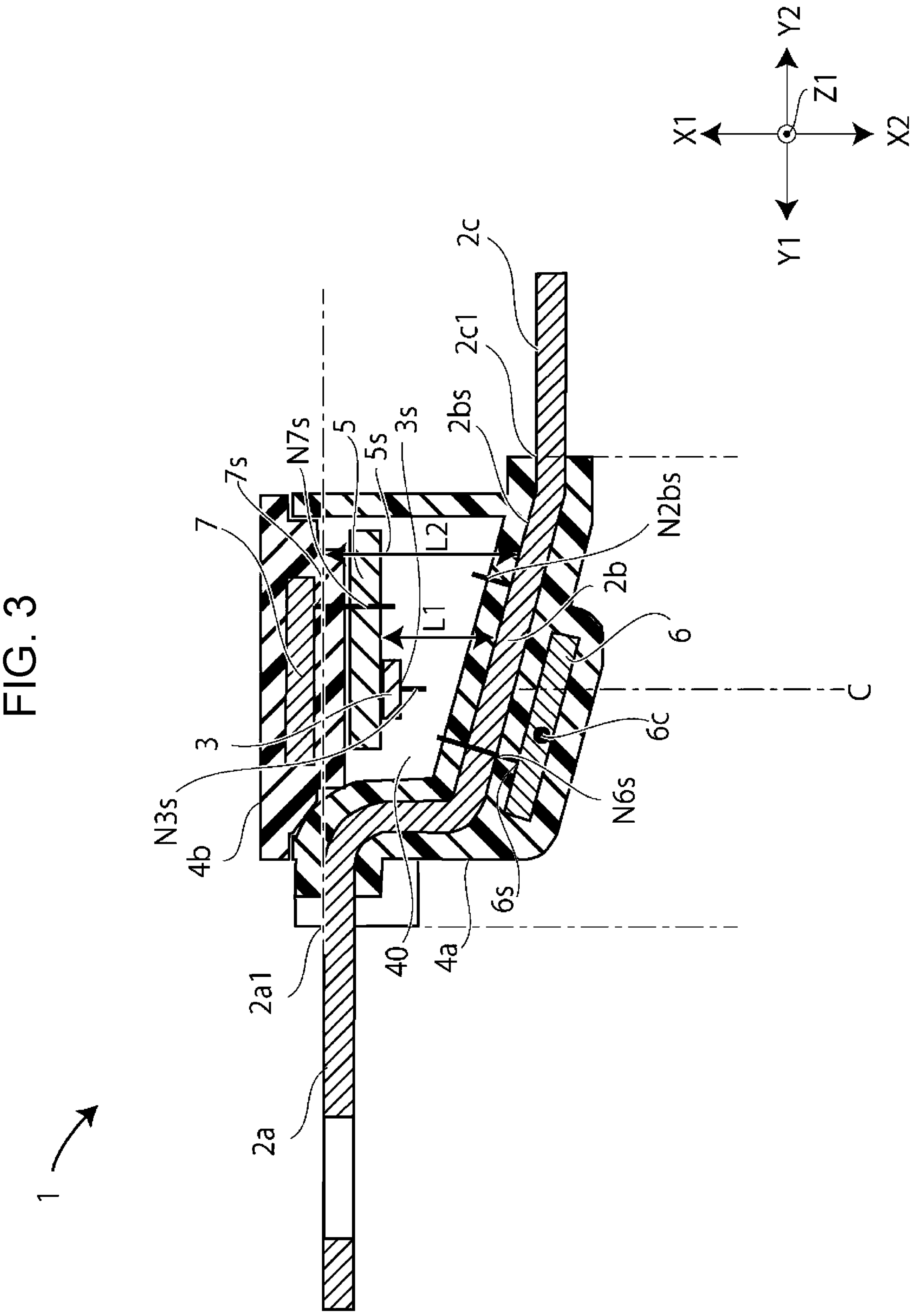
FIG. 3 is a sectional view schematically illustrating the cross section along line II-II, III-III in FIG. 1.

FIG. 2 is a partial perspective sectional view schematically illustrating a cross section along line II-II, III-III in FIG. 1. FIG. 3 is a sectional view schematically illustrating the cross section.

The current sensor 1 has bus bars 2, magnetism sensing portions 3, and a chassis 4.

The bus bar 2 is formed from a copper material, a brass material, an aluminum material, or the like. A current under measurement flows in the bus bar 2. The bus bar 2 is formed in a plate shape. The magnetism sensing portion 3 is placed so as to face a plate surface of the bus bar 2 on the X1 side in the X direction (first direction). In the Y direction (second direction) orthogonal to the X direction, the bus bar 2 has a first connection end 2*a* that protrudes from the Y1 side (one side) of the chassis 4 and also has a second connection end 2*c* that protrudes from the Y2 side (another side) of the chassis 4.

When the first connection end 2*a* and second connection end 2*c* of the bus bar 2 are viewed from the Z direction (third direction) orthogonal to the X direction and Y direction, their positions in the X direction differ from each other. Therefore, an opposing portion 2*b* of the bus bar 2, the opposing portion 2*b* facing a mounting surface 5*s* of a circuit board 5, on which the magnetism sensing portion 3 is mounted, is provided so as to cross the Y direction when viewed from the Z direction. In the embodiment of the present invention, a flat surface of the bus bar 2, the flat surface including a portion that overlaps the magnetism sensing portion 3 when viewed in the X direction, will be referred to as the opposing portion 2*b*.

The opposing portion 2*b* includes a portion that overlaps the circuit board 5 when the bus bar 2 is viewed in the X direction. Two plate surfaces of the opposing portion 2*b* correspond to the upper and lower sides (X1 and X2 in the X direction) of the chassis 4. Part of the bus bar 2 including the opposing portion 2*b* is insert-molded so that the part and a case 4*a* are formed integrally with each other.

The bus bar 2 is disposed so that the opposing portion 2*b* crosses the Y direction parallel to the mounting surface 5*s* of the circuit board 5, unlike the bus bar 102, illustrated in FIG. 10, the opposing portion 102*b* of which is disposed in parallel to the mounting surface 105*s* of the circuit board 105. Therefore, the length of a portion, of the bus bar 2, which links the first connection end 2*a* and second connection end 2*c* at different positions in the X direction together, that is, the length of a portion, of the bus bar 2, that is positioned inside the chassis 4 is shortened, so the resistance value of the bus bar 2 becomes small. With the current sensor 1, the resistance value of the bus bar 2 is reduced so that the amount of heat generated by the bus bar 2 due to a flow of a current under measurement is reduced.

The opposing portion 2*b* is formed so that a distance L1 between the opposing portion 2*b* and the mounting surface 5*s* of the circuit board 5, on which the magnetism sensing portion 3 is placed, gradually becomes large from the same side as the first connection end 2*a* (Y1 side) in the Y direction toward the same side as the second connection end 2*c* (Y2 side). Therefore, when a high-temperature unit, the temperature of which becomes relatively high, is connected to the second connection end 2*c*, heat transmission from the high-temperature unit to the magnetism sensing portion 3 through the bus bar 2 and circuit board 5 can be reduced. Therefore, it is possible to reduce the amount of heat received from the high-temperature unit and thereby to restrain the magnetism sensing portion 3 from becoming hot.

In FIGS. 2 and 3, an aspect in which the distance L1 between the opposing portion 2*b* and the mounting surface 5*s* gradually becomes large has been illustrated. However, it suffices that the opposing portion 2*b* is formed so that a distance L2 to a flat surface indicated by a dash-dot line in FIG. 3, the flat surface passing through a protruding portion 2*a*1 of the first connection end 2*a* and being parallel to the Y direction (second direction) and Z direction (third direction), gradually becomes large.

In the embodiment of the present invention, a portion of the first connection end 2*a*, the portion protruding from the chassis 4, will be referred to as the protruding portion 2*a*1. Similarly, a portion of the second connection end 2*c*, the portion protruding from the chassis 4, will be referred to as a protruding portion 2*c*1.

The magnetism sensing portion 3, which detects a magnetic field generated when a current under measurement flows in the bus bar 2, can sense a magnetic field in a direction parallel to a sensing surface 3*s*. To be more specific, the magnetism sensing portion 3 can sense a magnetic field in the Z direction. The sensitivity axis of the magnetism sensing portion 3 matches the Z direction. The magnetism sensing portion 3 is placed in parallel to a YZ plane so that the direction of a normal N3*s* of the sensing surface 3*s* becomes parallel to the X direction (first direction). Since the sensing surface 3*s* of the magnetism sensing portion 3 directly faces the opposing portion 2*b* of the bus bar 2, an induced magnetic field from the bus bar 2 can be precisely sensed. A magnetoresistance effect element, a hall element, or the like can be used as the detection element of the magnetism sensing portion 3.

The chassis 4 is composed of a case 4*a* having a storage space 40, which is open in the X direction, and a cover 4*b* that covers the storage space 40. The circuit board 5, on which the magnetism sensing portion 3 is mounted, is formed from an epoxy glass material, a ceramic material, or the like. The circuit board 5 is fixed to the case 4*a* with a fixing member (not illustrated) and is stored in the storage space 40.

With the current sensor 1, a first magnetic shield 6 and the opposing portion 2*b* of the bus bar 2 are insert-molded to the case 4*a*. A second magnetic shield 7 is insert-molded to the cover 4*b*. Since the bus bar 2 and magnetism sensing portion 3 are placed between the first magnetic shield 6 and the second magnetic shield 7, as will be described later in detail, disturbance magnetic field noise is blocked by the first magnetic shield 6 and second magnetic shield 7, and disturbance magnetic field noise applied to the magnetism sensing portion 3 can thereby be reduced, increasing the resistance of the magnetism sensing portion 3 to the disturbance magnetic field noise.

Since the first magnetic shield 6 is insert molded to the case 4*a* and the second magnetic shield 7 is insert molded to the cover 4*b*, the first magnetic shield 6 and second magnetic shield 7 can be placed at predetermined positions. Therefore, the current sensor 1 becomes superior in sensing precision. A stack of a plurality of metal plate-like bodies having the same shape, for example, is used as the first magnetic shield 6 and second magnetic shield 7. In each drawing used for explanation, however, the first magnetic shield 6 and second magnetic shield 7 are illustrated as one plate-like body instead of a stack of a plurality of plate-like bodies to simplify the drawing.

Figure 4:
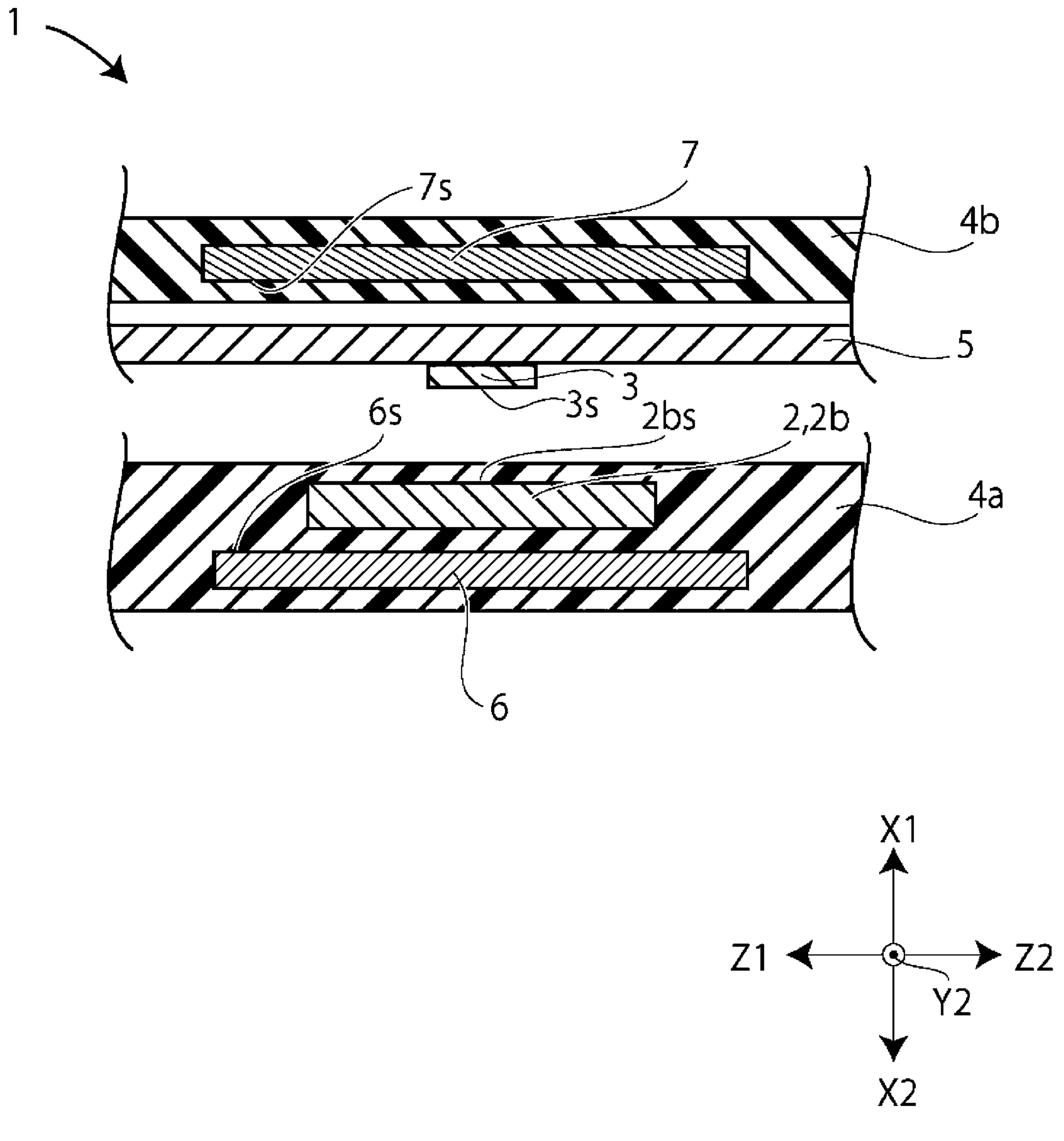
FIG. 4 is a sectional view schematically illustrating the positions of magnetic shields, a bus bar, a magnetism sensing portion, and a circuit board in the current sensor in FIG. 1.

FIG. 4 is a sectional view schematically illustrating the positional relationship among the first magnetic shield 6, second magnetic shield 7, bus bar 2, magnetism sensing portion 3, and circuit board 5 in the current sensor 1 in FIG. 1.

The first magnetic shield 6 and second magnetic shield 7 held in the chassis 4 of the current sensor 1 are formed in a plate-like shape.

The first magnetic shield 6 is disposed so that the normal direction of a magnetic shield surface 6*s* of the first magnetic shield 6 and the normal direction of an opposing surface 2*bs* of the opposing portion 2*b* become parallel to each other. The first magnetic shield 6 is placed on a side (X2 side) in the X direction, the side being opposite to the magnetism sensing portion 3 with respect to the opposing portion 2*b* of the bus bar 2. In other words, the first magnetic shield 6 is on the side, in the X direction, opposite to the magnetism sensing portion 3 with the bus bar 2 intervening between the first magnetic shield 6 and the magnetism sensing portion 3.

The second magnetic shield 7 is disposed so that the normal direction of a magnetic shield surface 7*s* of the second magnetic shield 7 and the normal direction of the sensing surface 3*s* of the magnetism sensing portion 3 become parallel to each other. The second magnetic shield 7 is placed on a side (X1 side) in the X direction, the side being opposite to the opposing portion 2*b* of the bus bar 2 with respect to the magnetism sensing portion 3. In other words, the second magnetic shield 7 is on the side, in the X direction, opposite to the bus bar 2 with the magnetism sensing portion 3 intervening between the second magnetic shield 7 and the bus bar 2.

When the first magnetic shield 6 and second magnetic shield 7 are of a flat plate type, the first magnetic shield 6 on the same side as the bus bar 2 is placed opposite to the opposing portion 2*b* so that the magnetic shield surface 6*s* becomes parallel to the opposing surface 2*bs* of the opposing portion 2*b*, as illustrated in FIGS. 3 and 4. The second magnetic shield 7 on the same side as the magnetism sensing portion 3 is placed so that the magnetic shield surface 7*s* becomes parallel to the sensing surface 3*s* of the magnetism sensing portion 3. In other words, a normal N6*s* of the magnetic shield surface 6*s* and a normal N2*bs* of the opposing surface 2*bs* are parallel to each other and a normal N7*s* of the magnetic shield surface 7*s* and the normal N3*s* of the sensing surface 3*s* are parallel to each other, but the normal N6*s* of the magnetic shield surface 6*s* and the normal N7*s* of the magnetic shield surface 7*s* are non-parallel to each other. Therefore, the bus bar 2 and magnetism sensing portion 3 are placed between the first magnetic shield 6 and the second magnetic shield 7, as described above.

The first magnetic shield 6 is placed closer to the first connection end 2*a* and at a position at which the first magnetic shield 6 overlaps the magnetism sensing portion 3 when viewed along the X direction. That is, with the current sensor 1, an intermediate point 6*c* of the first magnetic shield 6 in the Y direction is positioned closer to the protruding portion 2*a*1 than is a center line C in the Y direction between the protruding portion 2*a*1 of the first connection end 2*a* and the protruding portion 2*c*1 of the second connection end 2*c*. In contrast, with the current sensor 100 in related art illustrated in FIG. 10, an intermediate point 106*c* of a first magnetic shield 106 in the Y direction is positioned at the center line C in the Y direction between a protruding portion 102*a*1 of the first connection end 102*a* and a protruding portion 102*c*1 of the second connection end 102*c*.

In the above structure of the current sensor 1, the first magnetic shield 6 can be placed more on the X1 side than is the first magnetic shield 106 in the current sensor 100 in related art. This enables the downsizing of the current sensor 1 in the X direction.

Although the first magnetic shield 6 and second magnetic shield 7 in FIGS. 3 and 4 are formed in a flat-plate like as a whole, each of the first magnetic shield 6 and second magnetic shield 7 only needs to have a flat-plate portion formed in a flat-plate shape.

Figure 5:
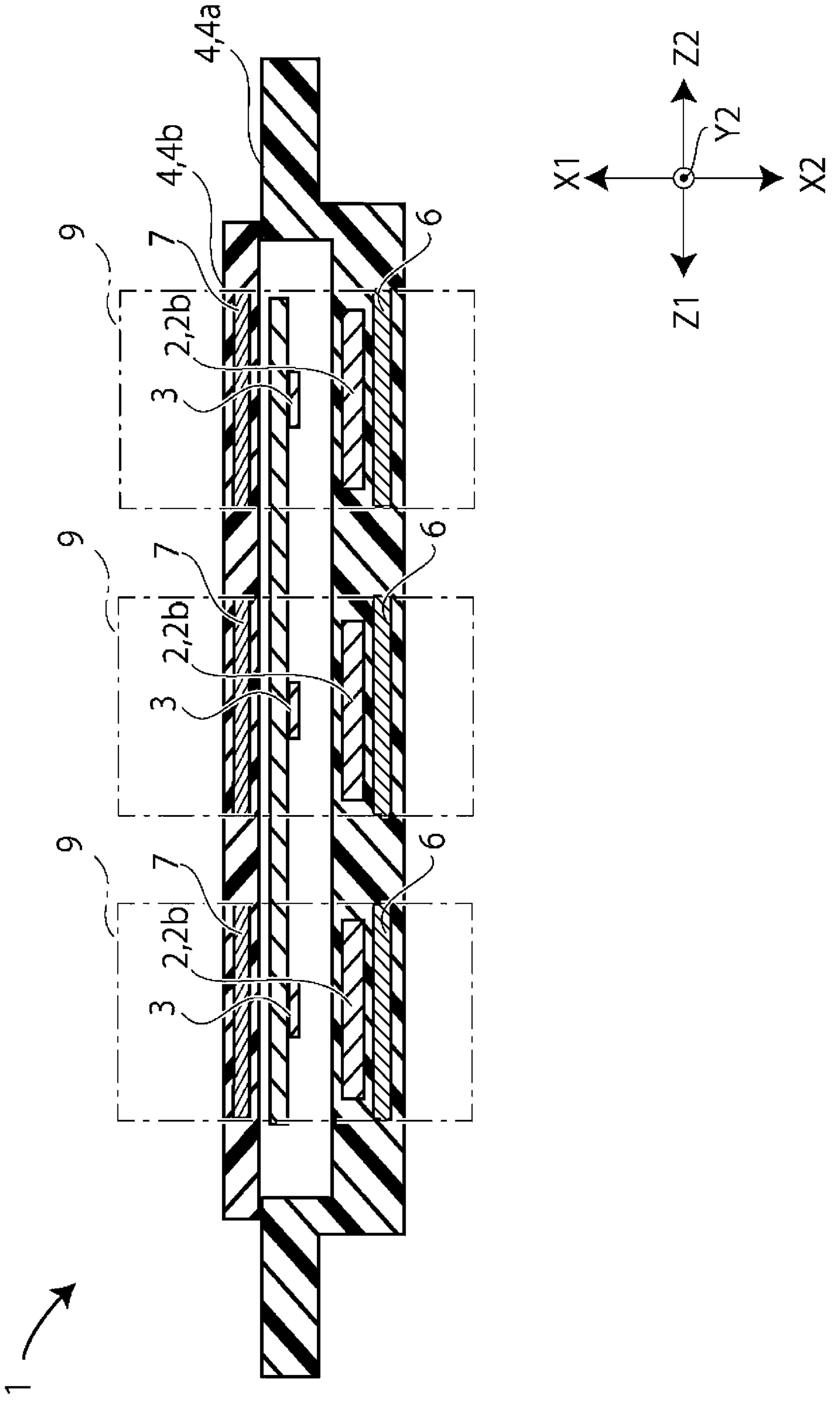
FIG. 5 is a sectional view schematically illustrating a cross section along line V-V in FIG. 1.

FIG. 5 is a sectional view schematically illustrating a cross section along line V-V in FIG. 1.

When a structure including the bus bar 2 and magnetism sensing portion 3 forms a measurement unit 9, a plurality of measurement units 9 are placed along the Z direction (third direction) and are integrally held in the chassis 4.

Due to the plurality of measurement units 9, it becomes possible to measure currents under measurement flowing in a plurality of bus bars. Since the plurality of measurement units 9 are integrally held in the chassis 4, each measurement unit 9 can be maintained at a predetermined position, so the current sensor 1 becomes superior in sensing precision.

Each measurement unit 9 in the current sensor 1 has the first magnetic shield 6 and second magnetic shield 7. However, a magnetic shield common to a plurality of bus bar 2 and to a plurality of magnetism sensing portions 3 may be provided, or a structure in which only one of the first magnetic shield 6 and second magnetic shield 7 is provided may be taken. Alternatively, a U-shaped magnetic shield may be used instead of the magnetic shield in a flat-plate shape.

Variations

Figure 6:
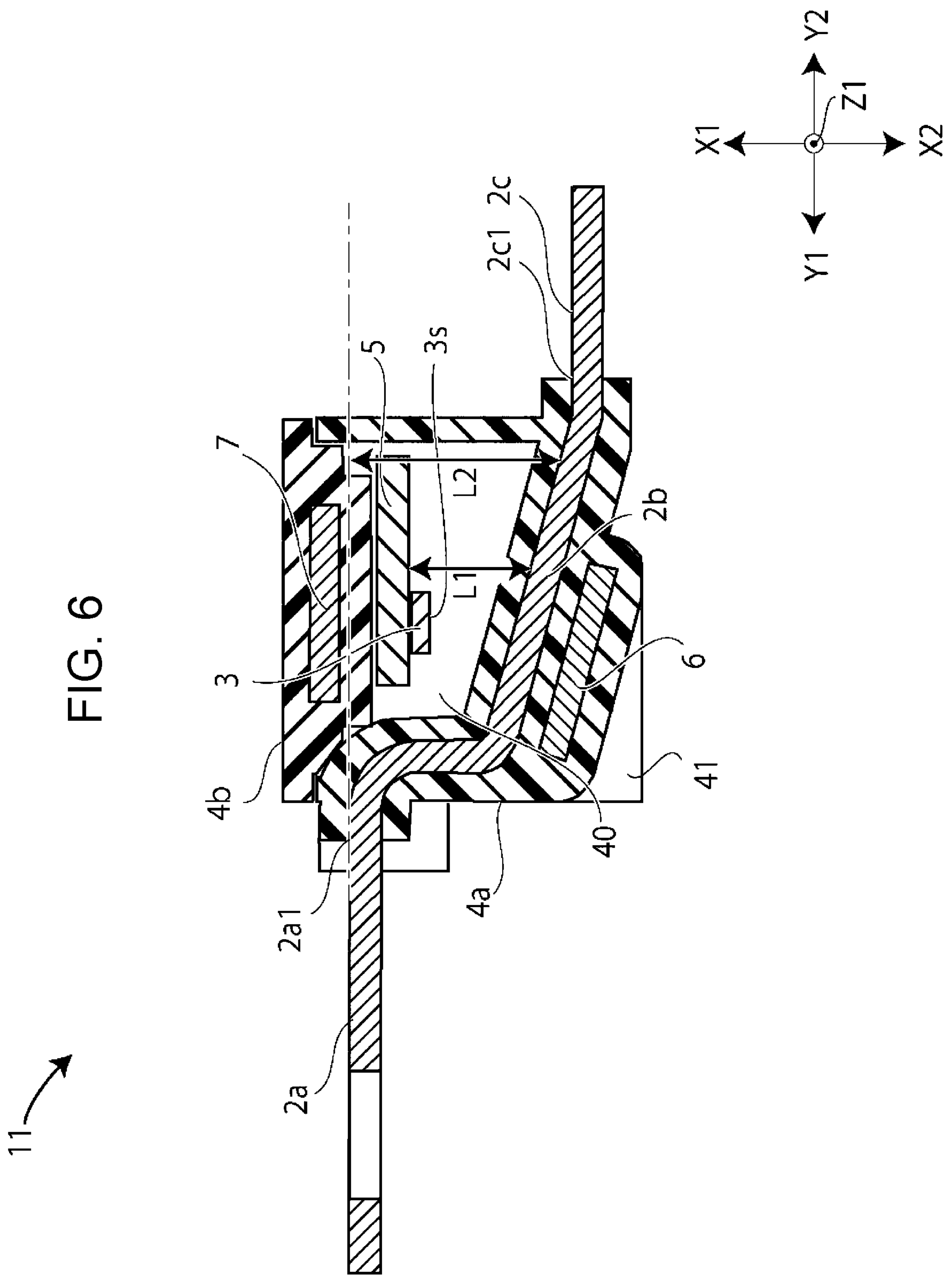
FIG. 6 is a sectional view schematically illustrating a cross section of a current sensor according to a variation.

FIG. 6 is a sectional view schematically illustrating a cross section of a current sensor 11 according to a variation.

Figure 7:
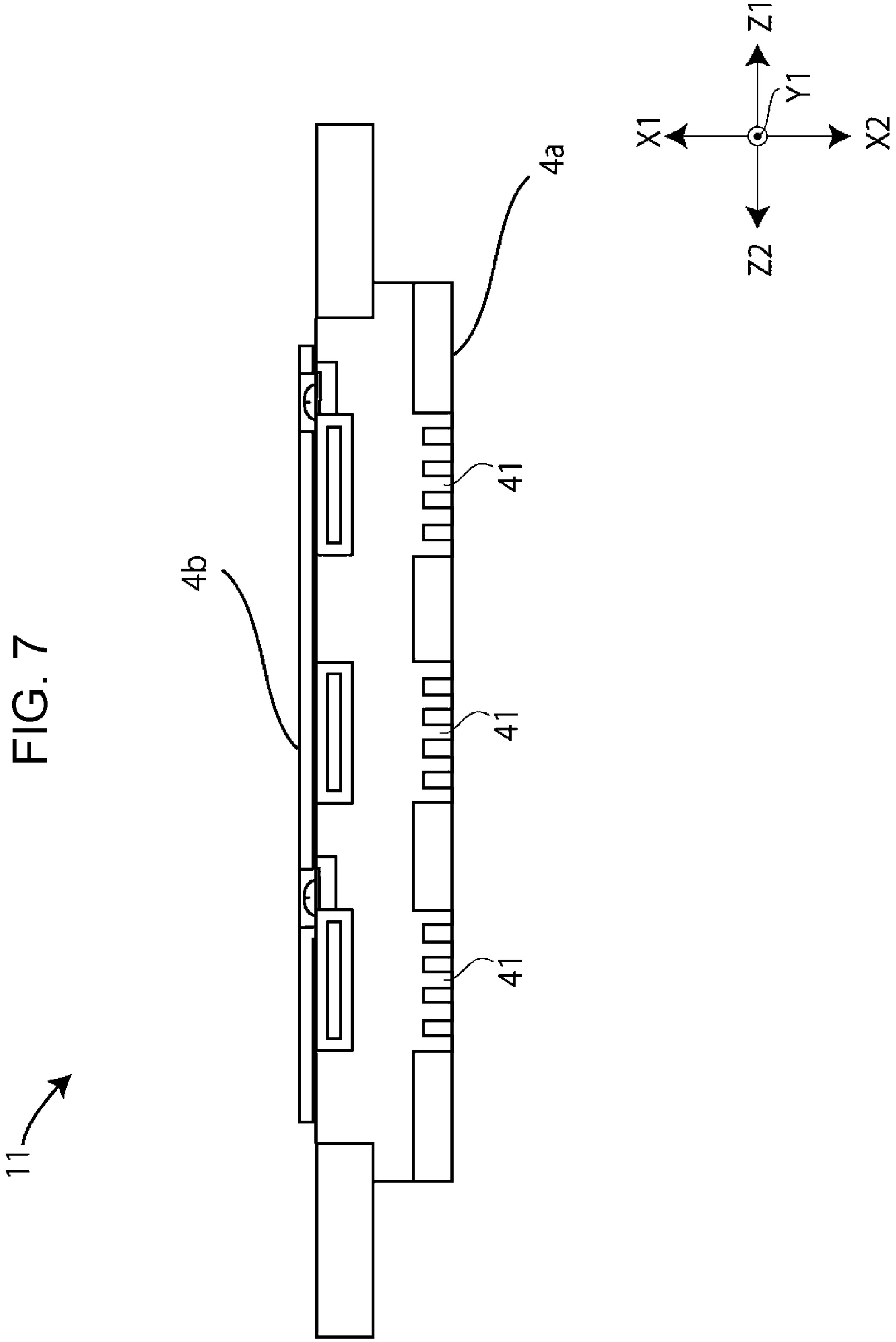
FIG. 7 is a front view schematically illustrating the current sensor in FIG. 6.

FIG. 7 is a front view schematically illustrating the current sensor 11 in FIG. 6.

The current sensor 11 differs from the current sensor 1 in that the case 4*a* of the chassis 4 incorporates heat sink portions 41.

The case 4*a* of the chassis 4 incorporates the heat sink portions 41 on the X2 side, in the X direction, which is opposite to the side on which the magnetism sensing portions 3 are placed, with respect to the opposing portions 2*b* of the bus bars 2. The surface area of the heat sink portion 41 is enlarged by arranging a plurality of members in a vane (fin) shape side by side as illustrated in FIG. 7 so as to improve the efficiency of dissipating heat in the storage space 40 to the outside of the case 4*a*. Therefore, it is possible to suppress a rise in temperature in the storage space 40 and thereby to reduce a rise in temperature in the magnetism sensing portion 3.

Since the heat sink portions 41 is formed in a space generated as a result of providing the opposing portion 2*b* of the bus bar 2 in a direction crossing the Y direction, the heat resistance of the magnetism sensing portion 3 can be improved without having to enlarge the size of the chassis 4.

Figure 8:
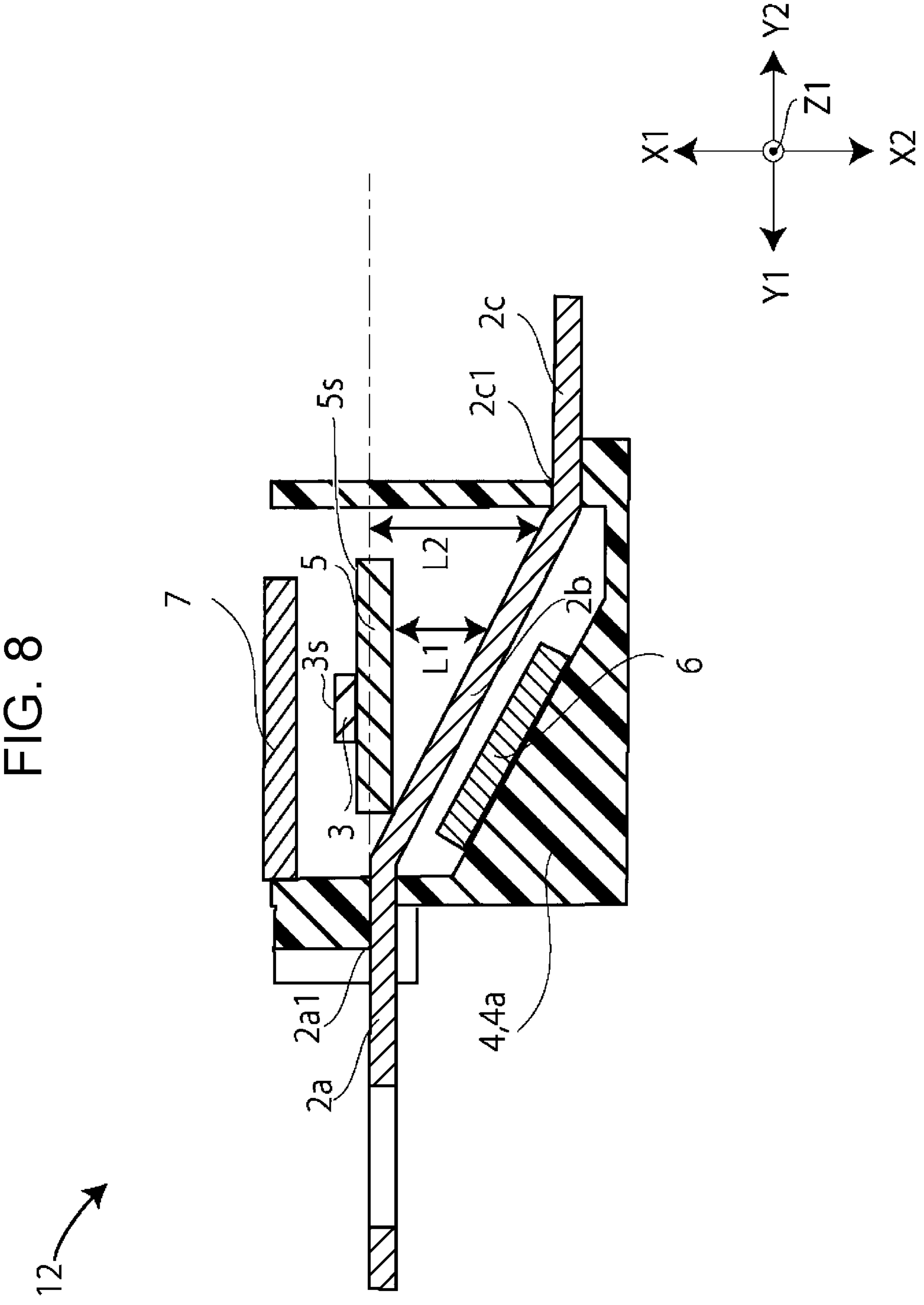
FIG. 8 is a sectional view schematically illustrating a cross section of a current sensor according to another variation.

FIG. 8 is a sectional view schematically illustrating a cross section of a current sensor 12 according to another variation.

The current sensor 12 differs from the current sensor 1 in that the bus bar 2 and first magnetic shield 6 are fixed with a fixing member, instead of being insert-molded to the case 4*a* of the chassis 4. Other differences are that: the mounting surface 5*s*, on which the magnetism sensing portion 3 is mounted, is a surface of the circuit board 5 on the X1 side, the surface being opposite to the bus bar 2; the chassis 4 is composed of only the case 4*a* and does not have the cover 4*b*; and the outside shape of the case 4*a* is not along the opposing portion 2*b* of the bus bar 2.

The structure of this variation is also intended to improve downsizing, weight reduction, ease of heat dissipation, and the like by, for example, omitting the cover 4*b*. Therefore, the bus bar 2 and the like may be insert-molded to the chassis 4 to achieve, for example, an integrated structure, as in the embodiment described above.

As with the current sensor 1, the current sensor 12 has the bus bar 2 disposed so that the opposing portion 2*b* crosses the Y direction. Since a portion, in the chassis 4, that includes the opposing portion 2*b* is shortened to reduce the resistance value of the bus bar 2, the amount of heat generated by the bus bar 2 due to a flow of a current under measurement is reduced.

Figure 9:
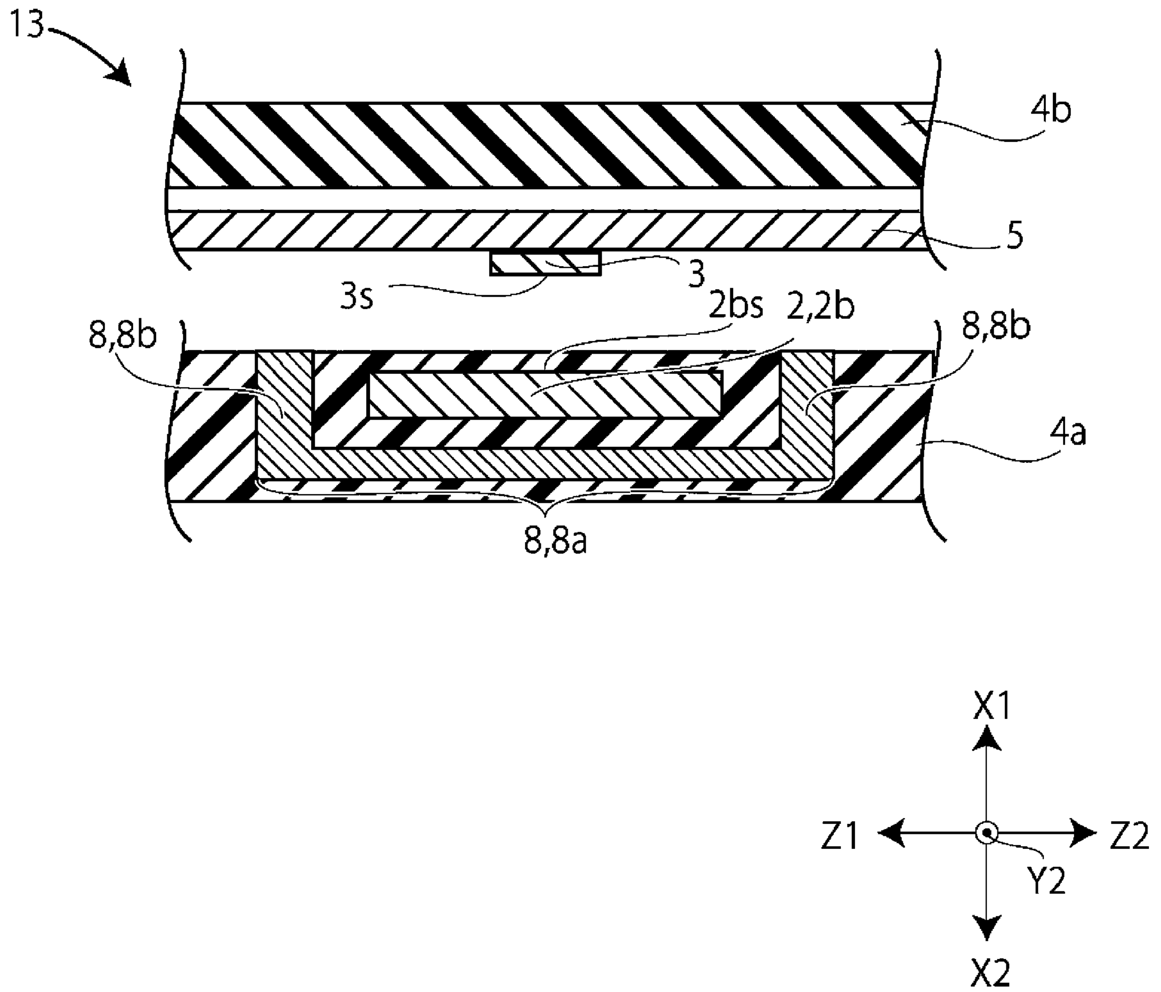
FIG. 9 is a sectional view schematically illustrating the positions of magnetic shields, a bus bar, a magnetism sensing portion, and a circuit board in the current sensor in yet another variation.

FIG. 9 is a sectional view illustrating the positional relationship among the bus bar 2, the magnetism sensing portion 3, the circuit board 5, and a magnetic shield 8 in a current sensor 13 in yet another variation.

The current sensor 13 has the magnetic shield 8 of U-shape type, the cross section of which is U-shaped, instead of the first magnetic shield 6 of flat plate type. The magnetic shield 8 has a base 8*a* formed in a flat plate shape and also has side walls 8*b* extending, from both ends of the base 8*a* in the Z direction (third direction), in the X direction, which is parallel to the normal direction of the base 8*a*, and toward the X1 side, on which the bus bar 2 is present. The magnetic shield 8 is placed so that the normal direction of the base 8*a* and the normal direction of the opposing surface 2*bs* of the opposing portion 2*b* become parallel to each other and that the base 8*a* and opposing portion 2*b* face each other.

The magnetic shield 8 of the current sensor 13 is placed so that the base 8*a* equivalent to the bottom of a U-shaped cross section becomes parallel to the opposing portion 2*b* and faces the opposing portion 2*b* and that the side walls 8*b* equivalent to both sides of the U-shaped cross section extend toward the same side as the magnetism sensing portion 3. In this structure, it is possible to more efficiently reduce the effect of noise on the magnetism sensing portion 3, the noise coming from the same side as the bus bar 2.

Although the current sensor 13 in FIG. 9 does not have the second magnetic shield 7, the current sensor 13 may be structured so as to have the magnetic shield 8 and second magnetic shield 7. In this case, the normal of the opposing surface 2*bs* of the bus bar 2 at the base 8*a* of the magnetic shield 8 and the normal of the magnetic shield surface 7*s* of the second magnetic shield 7 are non-parallel to each other as in the relationship between the normal N6*s* of the magnetic shield surface 6*s* of the first magnetic shield 6 and the normal N7*s* of the magnetic shield surface 7*s* of the second magnetic shield 7 (see FIG. 3).

The embodiment disclosed in this description is exemplary in all points. The present invention is not restricted to this embodiment. The scope of the present invention is not indicated by the description of only the embodiment described above but is indicated by the scope of the claims. It is intended that meanings equivalent to the scope of the claims and all modifications in the scope are included.

INDUSTRIAL APPLICABILITY

The present invention is useful as a current sensor that is attached to any type of unit and measures a current under measurement to control and monitor the unit.

What is claimed is:

1. A current sensor comprising:

a bus bar through which a current under measurement flows;

a magnetism sensing portion placed so as to face the bus bar along a first direction; and a chassis that incorporates the magnetism sensing portion and part of the bus bar; wherein the bus bar has a first connection end protruding from one side of the chassis in a second direction orthogonal to the first direction, and the bus bar has a second connection end protruding from another side of the chassis in the second direction, the first connection end and the second connection end are at different positions along the first direction in a cross section when viewed from a third direction orthogonal to each of the first direction and the second direction, and the cross section is on a plane extending along the first and second directions, the bus bar has an opposing portion that directly faces the magnetism sensing portion along the first direction, and the opposing portion elongates along an elongating direction, and a straight line passing through the magnetism sensing portion is not orthogonal to the elongating direction in the cross section when viewed from the third direction, and the straight line is parallel to the first direction.

2. The current sensor according to claim 1, wherein a distance between the opposing portion and a flat surface gradually becomes large from a side of the first connection end toward a side of the second connection end along the second direction, and the flat surface passes through a protruding portion of the first connection end and extends along the second direction and the third direction.

3. The current sensor according to claim 1, wherein:

the magnetism sensing portion has a sensing surface;

the magnetism sensing portion is capable of sensing a magnetic field in a direction parallel to the sensing surface; and the magnetism sensing portion is placed so that a normal direction of the sensing surface is parallel to the first direction.

4. The current sensor according to claim 1, further comprising a magnetic shield held in the chassis.

5. The current sensor according to claim 1, further comprising:

a first magnetic shield having a first flat plate portion formed in a first flat plate shape; and a second magnetic shield having a second flat plate portion formed in a second flat plate shape; wherein the first magnetic shield is placed at an opposite side of the magnetism sensing portion along the first direction with respect to the opposing portion, a normal direction of a magnetic shield surface of the first flat plate portion becomes parallel to a normal direction of an opposing surface of the opposing portion in another cross section when viewed from the second direction, and the another cross section is on another plane extending along the first and third directions, the second magnetic shield is placed at an opposite side of the opposing portion along the first direction with respect to the magnetism sensing portion, and a normal direction of a magnetic shield surface of the second flat plate portion becomes parallel to a normal direction of a sensing surface of the magnetism sensing portion in the another cross section when viewed from the second direction.

6. The current sensor according to claim 5, wherein:

the chassis is composed of a case having a storage space, which is open in the first direction, and a cover that covers the storage space;

the magnetism sensing portion is stored in the storage space;

the first magnetic shield and the opposing portion of the bus bar are insert-molded to the case; and the second magnetic shield is insert-molded to the cover.

7. The current sensor according to claim 4, wherein:

the magnetic shield has a base formed in a flat plate shape and side walls extending, from both ends of the base along the third direction, in a direction parallel to a normal direction of the base and toward a side on which the bus bar is present; and the magnetic shield is placed so that the normal direction of the base and a normal direction of the opposing portion become parallel to each other and the base and the opposing portion face each other in another cross section when viewed from the second direction, and the another cross section is on another plane extending along the first and third directions.

8. The current sensor according to claim 1, wherein the chassis has a heat sink portion on an opposite side of the magnetism sensing portion along the first direction with respect to the opposing portion.

9. The current sensor according to claim 5, wherein, when a structure including the bus bar and the magnetism sensing portion forms a measurement unit, a plurality of the measurement units are placed along the third direction and are integrally held in the chassis.

* * * * *